United States Patent [19]

Kim

[11] Patent Number: 5,474,950
[45] Date of Patent: Dec. 12, 1995

[54] METHOD FOR MANUFACTURING A CAPACITOR IN A SEMICONDUCTOR DEVICE

[75] Inventor: Jae K. Kim, Ichoneub, Rep. of Korea

[73] Assignee: Hyundai Electronics Industries Co., Ltd., Rep. of Korea

[21] Appl. No.: 141,406

[22] Filed: Oct. 22, 1993

[30] Foreign Application Priority Data

Oct. 24, 1992 [KR] Rep. of Korea ............... 1992-19675

[51] Int. Cl.$^6$ ........................................... H01L 21/8242
[52] U.S. Cl. ..................... 437/60; 437/52; 437/233; 437/919; 437/977; 148/DIG. 105
[58] Field of Search ............................ 437/47, 48, 52, 437/60, 192, 233, 919, 977; 257/309; 148/DIG. 105

[56] References Cited

U.S. PATENT DOCUMENTS

| | | | |
|---|---|---|---|
| 5,134,086 | 7/1992 | Ahn | 437/977 |
| 5,164,881 | 11/1992 | Ahm | 437/52 |
| 5,227,322 | 7/1993 | Ko et al. | 437/52 |
| 5,232,876 | 8/1993 | Kim et al. | 437/233 |
| 5,240,558 | 8/1993 | Kawasaki et al. | 437/233 |
| 5,254,503 | 10/1993 | Kenney | 437/228 |

FOREIGN PATENT DOCUMENTS 230561  10/1991  Japan .

*Primary Examiner*—Tom Thomas
*Attorney, Agent, or Firm*—Merchant, Gould, Smith, Edell, Welter & Schmidt

[57] ABSTRACT

The present invention provides a method for manufacturing a capacitor in a semiconductor device which increases a capacitance of the memory cell and improves a step coverage of a conducting material. The present invention provides a method for manufacturing a capacitor in a semiconductor device, comprising steps of: forming a first conducting layer 2, an oxide layer 3 and an A—B alloy 4a on an insulation layer 1 sequentially; settling a superfluous B material 4c dissolved in a A material 4b on the oxide layer 3 by a heat treatment so that the B material is separated from the A material; only etching the A material 4b by an echant and etching an exposed oxide layer 3 by using a settled B material 4c as an etch barrier; and etching an exposed first conducting layer 2 up to an intended depth by using the separated B material 4c and a residual oxide layer 3 as an etch barrier.

5 Claims, 4 Drawing Sheets

METHOD FOR MANUFACTURING A CAPACITOR IN A SEMICONDUCTOR DEVICE

BACKGROUND OF THE INVENTION

The present invention relates to a method for manufacturing a capacitor in a semiconductor device, particularly to a method for manufacturing a capacitor to have a large surface area by ruggedly forming a surface of a silicon layer.

Generally, as a density of memory device increases, an area of unit cell decreases. Though the area of unit cell decreases, a surface area of a charge storage electrode must increase so that a capacitance may be maintained uniformly. So, a stack capacitor is developed since a capacitance is not enough.

Also, the capacitance is increased by forming a capacitor to have a multilayer structure. However, the multilayer structure is formed in complexity and a step coverage of conducting material is inferior since an entire topology is elevated.

Accordingly, it is an object of the present invention to solve above mentioned problems.

It is a purpose of the present invention to provide a method for manufacturing a capacitor to have a large surface area in order to increase a capacitance.

THE SUMMARY OF THE INVENTION

The present invention relates to a method for manufacturing a capacitor in a semiconductor device comprising the steps of: forming a first conducting layer, an oxide layer and an alloy on an insulation layer sequentially; settling a superfluous one material dissolved in said alloy on the oxide layer by a heat treatment so that said one material is separated from another material; etching said another material by an echant and etching an exposed oxide layer by using said settled one material as an etch barrier; and etching an exposed first conducting layer up to an intended depth by using said settled one material and a residual oxide layer as an etch barrier.

BRIEF DESCRIPTION OF THE INVENTION

For understanding of the nature and objects of the invention, reference should be had to the following detailed description taken in conjunction with the accompanying drawings in which:

FIGS. 1A–F are a cross sectional views illustrating a process for manufacturing a capacitor according to one embodiment of the invention.

FIG. 2 is a cross sectional view illustrating a process for manufacturing a capacitor according to another embodiment of the invention.

DETAILED DESCRIPTION OF THE DRAWINGS

In referring to FIG. 1 an embodiment of the invention is described as follows.

Figure 1A:
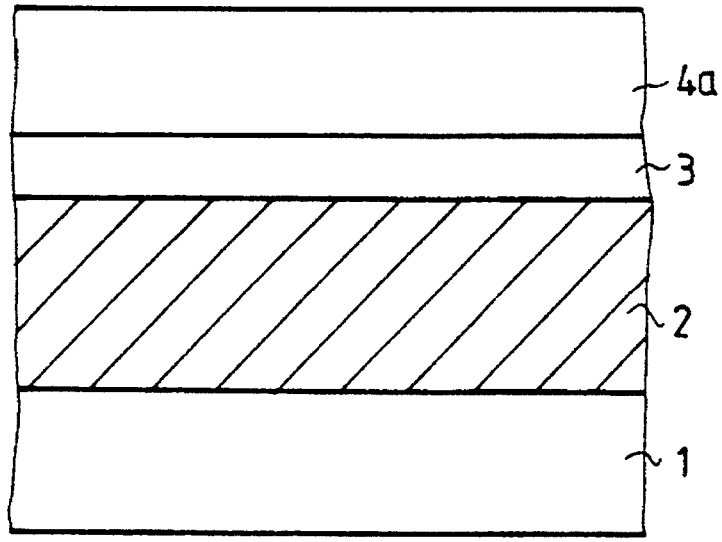

Referring to FIG. 1A, a first conducting layer 2, for example a first silicon layer, and an etch barrier 3, for example oxide layer, are sequentially deposited on an insulation layer 1.

Next, an alloy 4a including two materials (hereinafter referred to A material, B material), for example an Al—Si alloy, is deposited on the entire structure.

An content of a B material must be larger than a solubility of B material in a A material at a temperature of a heat treatment.

For example, in the case of the Al—Si alloy, the silicon is added from 1% to 30% since a solubility of a silicon in an aluminum is 0.5% at 400° C. temperature, that is, one of a temperature of the heat treatment.

Figure 1B:
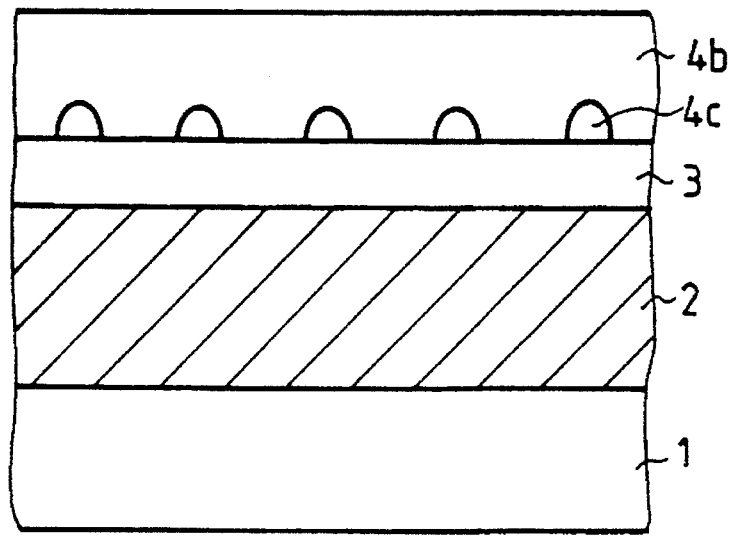

Referring to FIG. 1B, a superfluous B material 4c dissolved in the A material 4b is settled on the oxide layer 3 by performing the heat treatment in a designated temperature. So, the A material 4c is separated from the B material 4b.

Also, the heat treatment can be performed by raising a temperature of a substrate, simultaneously with the A—B alloy 4a being deposited on the entire structure. A temperature of the heat treatment is 100° C.–550° C. temperature in the case of the Al—Si alloy.

Figure 1C:
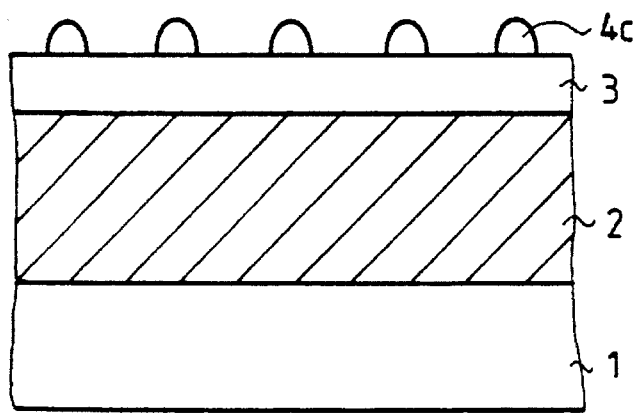

Referring to FIG. 1C, the A material 4b is etched by an etchant and the separated B material 4c is left on the oxide layer 3. In the case of the Al—Si alloy, the aluminum 4b is only etched by $H_3PO_4$ solution or dry etch process containing chlorine radical, and the first silicon layer 4c is left on the oxide layer.

Figure 1D:
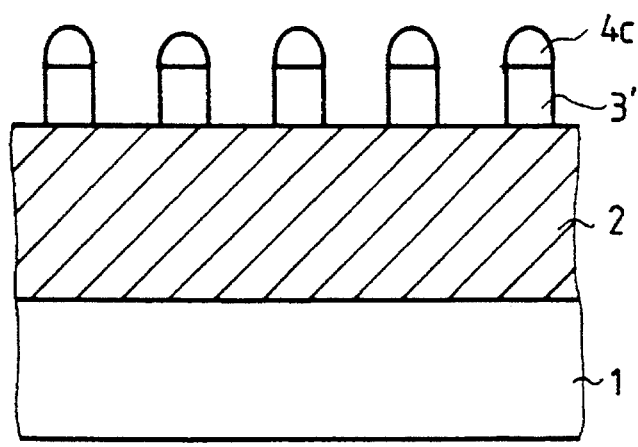

Referring to FIG. 1D, by using the separated B material 4c as an etch barrier, a residual oxide layer 3' is formed by etching a part of an exposed oxide layer 3.

A topology of the B material 4c can be changed by adjusting a content of the B material 4c in the A—B alloy 4a. So, an etch depth of the first silicon layer 2 can be adjusted.

Figure 1E:
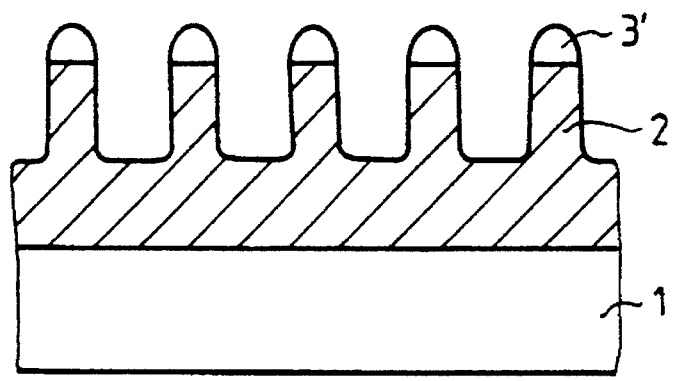

Referring to FIG. 1E, an exposed first silicon layer 2 is etched by using the B material 4c and the residual oxide layer 3' as an etch barrier.

Figure 1F:
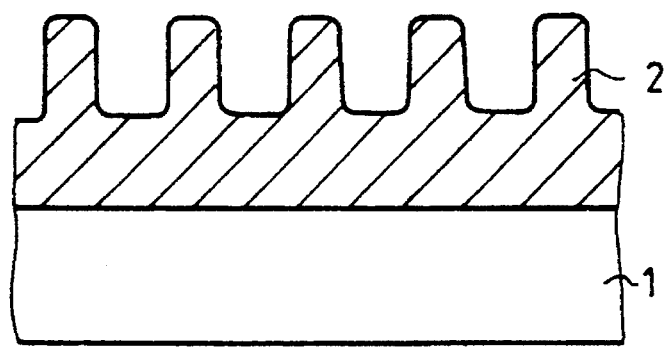

Referring to FIG. 1F, the residual oxide layer is eliminated. So, a capacitor having large surface area is formed.

Figure 2:
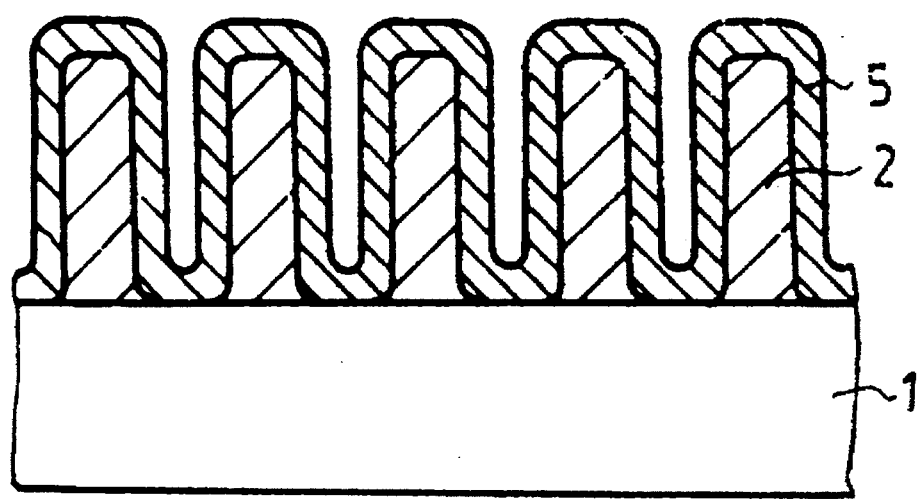

In referring to FIG. 2, another embodiment of the invention is described as follows.

A process from FIG. 1A to FIG. 1D is sequentially performed in the same manner.

Next, the first silicon layer 2 is etched up to a surface of the insulation layer 1 by using the B material 4c and an residual oxide layer 3' as an etch barrier. So, a separated first silicon layer 2 is formed.

Next, the residual oxide layer 3' is eliminated and a second silicon layer 5 having an intended thickness is formed on the entire structure.

The present invention gives benefit to increase a capacitance of the memory cell since the surface area of silicon layer is increased.

Also, the present invention gives benefit to improve a step coverage of a conducting material.

What is claimed is:

1. A method for manufacturing a capacitor in a semiconductor device comprising the steps of:

forming a first conducting layer, an oxide layer, and an alloy including a A material and a B material, on an insulation layer sequentially;

settling a superfluous B material dissolved in said alloy on the oxide layer by a heat treatment so that said superfluous B material is separated from said A material;

etching said A material by an echant and etching an exposed oxide layer by using said settled superfluous B material as an etch barrier to form a settled superfluous B material and a residual oxide layer;

etching an exposed first conducting layer to a surface of the insulation layer by using said settled superfluous B material and said residual oxide layer as an etch barrier;

eliminating said superfluous B material and said residual oxide layer; and forming a second silicon layer on surface of remaining first conducting layer and exposed insulation layer;

wherein said alloy is a Al—Si alloy.

2. A method for manufacturing a capacitor according to claim 1 wherein said heat treatment is performed by increasing a temperature of a substrate, simultaneously with said alloy being deposited on said oxide layer.

3. A method for manufacturing a capacitor according to claim 1, wherein said echant is a $H_3PO_4$ solution or a gas containing a chlorine radical.

4. A method for manufacturing a capacitor according to claim 1, wherein a temperature of said heat treatment of said Al—Si alloy is from 100° C. to 550° C.

5. A method for manufacturing a capacitor according to claim 1, wherein a content of silicon in said Al—Si alloy is from 1% to 30%.

* * * * *